(12) United States Patent
Takagaki et al.

(10) Patent No.: US 7,130,775 B2
(45) Date of Patent: Oct. 31, 2006

(54) INTEGRATED BUILDING PRODUCTION INFORMATION SYSTEM

(75) Inventors: Tohru Takagaki, Minato-ku (JP); Shunsuke Tanaka, Minato-ku (JP); Hiroshi Tamai, Minato-ku (JP); Takerou Yasuzawa, Minato-ku (JP); Ayako Yasaka, Minato-ku (JP); Minoru Tsujimoto, Minato-ku (JP); Yukio Endou, Minato-ku (JP); Yasufumi Tani, Minato-ku (JP); Yukio Sano, Minato-ku (JP); Manabu Takagi, Minato-ku (JP); Taketoshi Takahashi, Minato-ku (JP); Shigehiko Ueno, Minato-ku (JP); Teturou Uenami, Minato-ku (JP); Kazuo Wakasugi, Minato-ku (JP)

(73) Assignee: Kajima Corporation, Tokyo (JP)

( * ) Notice: Subject to any disclaimer, the term of this patent is extended or adjusted under 35 U.S.C. 154(b) by 496 days.

(21) Appl. No.: 10/474,967

(22) PCT Filed: Nov. 5, 2002

(86) PCT No.: PCT/JP02/11514

§ 371 (c)(1),
(2), (4) Date: Oct. 15, 2003

(87) PCT Pub. No.: WO03/040969

PCT Pub. Date: May 15, 2003

(65) Prior Publication Data

US 2004/0145614 A1    Jul. 29, 2004

(30) Foreign Application Priority Data

Nov. 7, 2001  (JP) .............................. 2001-342086
Apr. 24, 2002 (JP) .............................. 2002-121540

(51) Int. Cl.
*G06F 17/50* (2006.01)

(52) U.S. Cl. .......................... 703/1; 707/205; 715/964

(58) Field of Classification Search .................. 703/1; 345/418; 700/98, 182; 715/964; 707/205
See application file for complete search history.

(56) References Cited

U.S. PATENT DOCUMENTS

| | | | | |
|---|---|---|---|---|
| 5,740,341 A | * | 4/1998 | Oota et al. .................. | 345/420 |
| 6,721,769 B1 | * | 4/2004 | Rappaport et al. .......... | 707/205 |
| 6,816,861 B1 | * | 11/2004 | Ikeda et al. ................... | 707/10 |
| 6,859,768 B1 | * | 2/2005 | Wakelam et al. .............. | 703/1 |
| 6,996,503 B1 | * | 2/2006 | Jung ............................. | 703/1 |

FOREIGN PATENT DOCUMENTS

| | | |
|---|---|---|
| JP | 8-190581 | 7/1996 |
| JP | 2001-243267 | 9/2001 |
| JP | 2001-283050 | 10/2001 |

* cited by examiner

*Primary Examiner*—Albert W. Paladini
(74) *Attorney, Agent, or Firm*—Koda & Androlia

(57) ABSTRACT

An integrated building production information system including design CAD (computer-aided-design) based on software of building, structure, and equipment, and databases built in the outside separately from the design CAD, the databases making an integrated DB (shared database)-CAD system of building, structure and equipment as an execution-linked system in DB-CAD's sharing of a standard database, wherein the integrated building production information system stores the information made compatible by three-dimensional superposition at the time of design into a shared database (DB) of the integrated DB-CAD system, and further receives and links information of this shared database to external systems such as a skeleton drawing CAD, a reinforcing bar and steel frame system and the like and produces execution information.

4 Claims, 9 Drawing Sheets

Data flow explaining diagram

Fig. 6
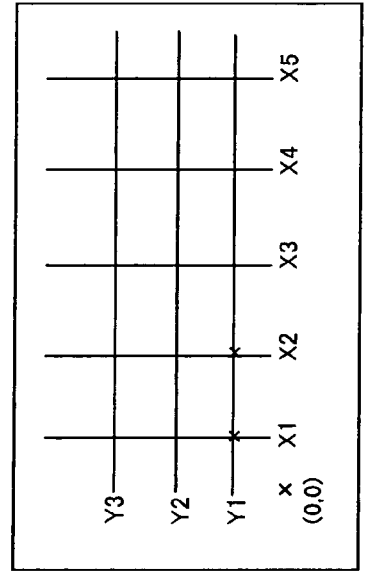
The opposite side model
| Center name | Starting point coordinate(X) | Starting point coordinate(Y) | End point coordinate(X) | End point coordinate(Y) |
|---|---|---|---|---|
| X1 | 5000 | -2000 | 5000 | 25000 |
| X2 | 10000 | -2000 | 10000 | 25000 |
| X3 | 15000 | -2000 | 15000 | 25000 |
| X4 | 20000 | -2000 | 20000 | 25000 |
| X5 | 25000 | -2000 | 25000 | 25000 |
| Y1 | -2000 | 5000 | 30000 | 5000 |
| Y2 | -2000 | 10000 | 30000 | 10000 |
| Y3 | -2000 | 15000 | 30000 | 15000 |
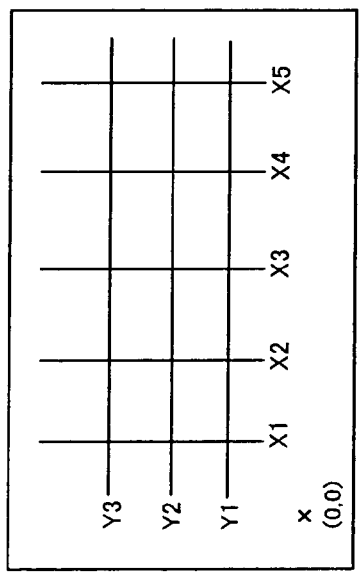
This side model (read side)
Center information
| Center name | Starting point coordinate(X) | Starting point coordinate(Y) | End point coordinate(X) | End point coordinate(Y) |
|---|---|---|---|---|
| X1 | 10000 | 2000 | 10000 | 30000 |
| X2 | 15000 | 2000 | 15000 | 30000 |
| X3 | 20000 | 2000 | 20000 | 30000 |
| X4 | 25000 | 2000 | 25000 | 30000 |
| X5 | 30000 | 2000 | 30000 | 30000 |
| Y1 | 0 | 10000 | 35000 | 10000 |
| Y2 | 0 | 15000 | 35000 | 15000 |
| Y3 | 0 | 20000 | 35000 | 20000 |

Fig. 8

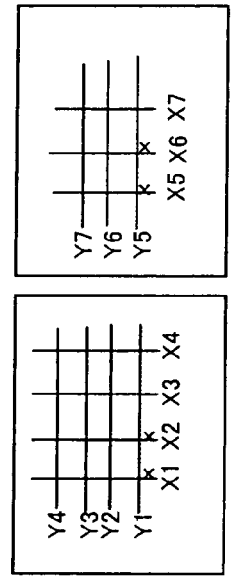

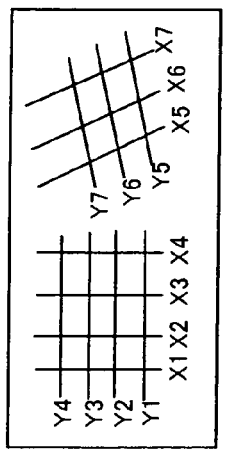

This side model

| Center name | Starting point coordinate(X) | Starting point coordinate(Y) | End point coordinate(X) | End point coordinate(Y) |
|---|---|---|---|---|
| X1 | | | | |
| X2 | | | | |
| X3 | | | | |
| X4 | | | | |
| X5 | | | | |
| X6 | | | | |
| X7 | | | | |
| Y1 | | | | |
| Y2 | | | | |
| Y3 | | | | |
| Y4 | | | | |
| Y5 | | | | |
| Y6 | | | | |
| Y7 | | | | |

The opposite side model

| Center name | Starting point coordinate(X) | Starting point coordinate(Y) | End point coordinate(X) | End point coordinate(Y) |
|---|---|---|---|---|
| X1 | | | | |
| X2 | | | | |
| X3 | | | | |
| X4 | | | | |
| Y1 | | | | |
| Y2 | | | | |
| Y3 | | | | |
| Y4 | | | | |

| Center name | Starting point coordinate(X) | Starting point coordinate(Y) | End point coordinate(X) | End point coordinate(Y) |
|---|---|---|---|---|
| X5 | | | | |
| X6 | | | | |
| X7 | | | | |
| Y5 | | | | |
| Y6 | | | | |
| Y7 | | | | |

| Center name | Starting point coordinate(X) | Starting point coordinate(Y) | End point coordinate(X) | End point coordinate(Y) | Flag | Center position(X) | Center position(Y) | Radius |
|---|---|---|---|---|---|---|---|---|
| X1 | | | | | | | | |
| X2 | | | | | | | | |
| X3 | | | | | | | | |
| Y1 | | | | | 1 | X0 | Y0 | R |
| Y2 | | | | | 1 | X0 | Y0 | R |
| Y3 | | | | | 1 | X0 | Y0 | R |

INTEGRATED BUILDING PRODUCTION INFORMATION SYSTEM

BACKGROUND OF THE INVENTION

1. Technical Field of the Invention

The present invention relates to an integrated building production information system capable of making the work solution of a design department and an execution department more rational and more efficient by electronicizing key jobs (integration, estimation, procurement, profit-and-loss management and the like) of the production side in a field of construction.

2. Background Art

Particularly, the present invention relates to a database CAD (computer-aided design) system which can aim at making more efficient and more laborsaving the work of preparing design drawings and specifications and at improving the productivity and quality by making it possible for personal computers using CAD software connected with a database to grasp necessary quantities and share necessary data for design among the personal computers, by integrating specifications and quantities in a design work using CAD's performed by each personal computer, and by unifying the data flow from design information to estimation and execution information.

Up to now, pattern information (drawing information) as information for building production has been generally communicated by means of "paper".

On the contrary, in recent years, with the advance of information-systematization in each domain of building production, CAD is extensively used and the present purpose of it is to improve the efficiency of drawing figures and the quality of drawing representation.

Thus, due to the above-mentioned purpose, the range of utilization of CAD stays mostly within each domain specific to design or execution.

From 1980's to the early part of 1990's, "CAD systems for integrating design and execution into a consistent work" were developed by many companies including general constructors, and features common to them are as follows.
(1) A minicomputer or an EWS (engineering workstation) is utilized as a base;
(2) Attribute parameters are made separately by the respective companies;
(3) Jobs of picking and totalizing quantities are performed within a single system;
(4) Mainly the scope of utilization of the system is on and after an execution design stage; and
(5) The system is operated by an operator.

However, for all CAD data of drawings made with much effort, there has not been a mechanism for utilizing them in a process of estimating quantities or preparing execution drawings being the next process.

Estimated quantities have been computed mainly by an outside order estimation office on the basis of design drawings (paper information), and execution drawings have also been made mainly by an outside order office as definitely settling pending parts in design drawings and adding information of execution to them.

On the other hand, execution design drawings and specifications representing the contents of estimation and contract have contained a too small amount of information and a too large amount of pending contents to perform execution as they are.

The present situation in which redo or readjustment occurs due to defining the contents of design or specifications as preparing execution drawings in course of construction and the next process is performed as the execution information is not definitely determined. Such present situation has hindered the rationalization in various aspects.

In order to promote the rationalization of building production, it is necessary to make the degree of definite settlement as high as possible at an upstream stage, namely, at a design stage in an early process.

And the maximum usefulness of electronic information including CAD data is clearly the possibility of using the data in various applications, and in order to improve the efficiency of building production by making the best use of its property, it is necessary to distribute design information generated at an early stage of a project as converting the design information so as to meet each stage of production.

Thereupon, there is a synthetic drawing preparation system of Japanese Patent Laid-Open Publication No. Hei 8-235,243 of a Japanese patent application among matters filed as a synthetic drawing preparation system making it possible to uniformly handle building drawing data and equipment drawing data prepared by heterogeneous CAD apparatuses.

This is a synthetic drawing preparation system which converts drawing data among a building CAD apparatus for preparing building drawings, an equipment CAD apparatus for preparing equipment drawings and a synthetic CAD apparatus for preparing synthetic drawings, said system converting drawing data on the layer of the building CAD apparatus or equipment CAD apparatus and drawing data on the layer of the synthetic CAD apparatus into each other, and preparing synthetic drawings by means of the synthetic CAD apparatus on the basis of drawings prepared by the building CAD apparatus and the equipment CAD apparatus.

According to this Japanese Patent Laid-Open Publication No. Hei 8-235,243, drawings of the building side such as plan detail drawings, skeleton drawings and the like to be prepared by building CAD apparatuses are made by the respective building CAD apparatuses.

Since the prepared drawings have the data formats of the respective dedicated CAD apparatuses, they are converted into the DXF format and converted from each unique layer of these dedicated CAD apparatuses into the layer of the synthetic CAD apparatus.

And each of drawings to be prepared by the equipment side such as drawings of electric equipment, sanitary equipment, air conditioning equipment and the like is made by a CAD apparatus possessed by each subcontractor in charge of equipment.

Since the prepared drawings have the data formats of the respective dedicated CAD apparatuses, they are converted into the DXF format and converted from each unique layer of these dedicated CAD apparatuses into the layer of the synthetic CAD apparatus.

A processing synthetic CAD apparatus in a synthetic CAD apparatus can handle uniformly drawings made by a building CAD apparatus or an equipment CAD apparatus. In case that a building side performs a change having an influence on the whole execution, for example, a synthetic CAD apparatus converts the data format and layer of a changed drawing and passes the converted drawing data to another building CAD apparatus or equipment CAD apparatus, which can perform a necessary change on the basis of the changed drawing data by means of each dedicated CAD. The changed drawing is converted in the synthetic CAD apparatus side and is combined with a layer according to a synthetic drawing and outputted to a display device or a plotter.

In this way, since a drawing made by each dedicated CAD apparatus can be handled by another dedicated CAD apparatus, a modification based on some changed spot can be handled uniformly by a building side or an equipment side and, therefore, even a large-scale building can be corrected exactly and quickly.

However, said synthetic drawing preparation system of Japanese Patent Laid-Open Publication No. Hei 8-235,243 is a system for securing the compatibility in a job of making a synthetic drawing at an execution stage but is not a system for securing the compatibility at a design stage. Securing the compatibility at an execution stage results in having many pending matters, and redo and readjustment occur even in the course of execution as described above and the rationalization is hindered in various aspects by entering the next process as leaving necessary information not definitely determined.

And this system uses pattern data of a drawing but does not inheritably use the attribute of a design drawing. The linkage of such pattern data is low in the degree of freedom and the CAD data of a design drawing can be utilized in making a synthetic drawing in the next process as pattern data, but since the attribute of it is not utilized, the data cannot be utilized in calculation of quantities to be estimated.

Further, said synthetic drawing preparation system of Japanese Patent Laid-Open Publication No. Hei 8-235,243 is a system which fully performs a layer management of drawing data and converts the layer of drawing data into a layer configuration convenient for a synthetic drawing on the basis of a predetermined rule of layer conversion, but the layer rule is not often strictly observed and an effective result cannot be often obtained. Generally, management based on layer is effective for an object but is often ineffective for another object, and in case of using a layer management for another object, such a system performs conversion but often cannot effectively distribute data.

Further, the synthetic drawing preparation system of Japanese Patent Laid-Open Publication No. Hei 8-235,243 is supposed as a system primarily handling two-dimensional matters and cannot perform examination from an optional direction in confirming the compatibility and is difficult to estimate exactly the quantities.

By the way, in order to integrate building production information, it is necessary to take the compatibility among building information, structure information and equipment information, but it is caused by the following reasons that CAD systems of building, structure and equipment have not been unified and have not come to spread. There are such reasons as a fact that a CAD system has been expensive in lease expense of hardware/software, maintenance cost and the like, a fact that there has not been a receiver of data since CAD has not been popular in building sites, a fact that estimation is often performed by manually picking up and no electronic data have been utilized in a downstream process, and a fact that an operator has been required not only to operate a CAD system but also to have deep knowledge of both design drawings and execution drawings, namely, a young operator skilled in operation of CAD has also needed to be skilled in settlement or sequence of execution and the like.

Further, the following factors are conceivable.

The work of a conventional CAD system is only the exchange of pattern data in the DWG format or DXF format and exchanges data having no attribute from beginning to end.

And two-dimensional data are primarily handled and the correction of errors caused by conversion requires much time, and it is difficult to check the compatibility by means of two-dimensional superposition of pattern data.

DISCLOSURE OF THE INVENTION

The present invention aims at solving said disadvantages of the prior art, and a first object of the invention is to realize improving the quality of a design drawing and provide an integrated building production information system in which information is unified by developing a function of linking CAD information and high-quality data being excellent in compatibility made at an execution design stage can be obtained as a result that the compatibility can be spontaneously obtained or that the efficiency of collation work can be improved.

A second object of the invention is to shorten the whole process and provide an integrated building production information system in which a work of making data compatible can be easily advanced further in a short time, and, therefore, the whole process is shortened and furthermore, the compatible data can be diverted and utilized at the estimation and execution stages after the execution design stage and the efficiency of building production can be comprehensively improved.

A first feature of the present invention in order to achieve the above-mentioned objects provides as its main purport an integrated building production information system comprising a design CAD based on software of building, structure and equipment, and a database built in the outside separately from this design CAD, said database making an integrated DB-CAD system of building, structure and equipment as an execution-linked system in DB-CAD's sharing data of a standard database, wherein said integrated building production information system stores the information made compatible by three-dimensional superposition at the time of design into the shared database (DB) of the integrated DB-CAD system and further receives and links information of this shared database to external systems such as a skeleton drawing CAD, reinforcing bar and steel frame systems and the like and makes execution information.

Describing in more detail, according to the present invention, design CAD's are based on different software products according to the respective features of building, structure and equipment (building: Graphisoft, structure: AutoCAD, and equipment: CADWe'll CAPE) and databases share MDB data of Microsoft Access being a standard database of Kajima, and since a database made of CAD data is not shared but a database disconnected separately from CAD is made in the outside and shared in such a way, it is enough to develop only an interface part for connecting a CAD software product with a database and exchanging information between them.

Further, it is enough to use only de facto standard articles available anywhere on the market as a CAD software product and a database software product, said articles being easy to use and arrange.

In addition to this, an execution-linked system (for estimating quantities and making execution drawings), which can be integrated with a DB-CAD (database CAD), receives information of a shared database, diverts design data to the execution-linked system and thereby links these data to a skeleton drawing CAD or reinforcing bar and steel frame systems, and performs consistently operations to the estimation of quantities and the preparation of execution drawings, and thereby makes it possible to improve the efficiency of work and reduce the expense of estimation/preparation of execution drawings.

And information of the shared database is excellent in compatibility due to integrated utilization of DB-CAD's of building, structure and equipment systems, and can be made higher in degree of definite settlement by making execution design drawings, and makes it possible to take information of an execution side into design at an early stage and improve the compatibility and linkage between design drawings and execution drawings.

As for execution, a branch office or the like can manage for itself the quantities to be the core of a building by utilizing the estimated quantities; and by incorporating information of the execution side into design at an early stage and performing a high-compatibility design being high in degree of definite settlement, it is possible to reduce redoing jobs caused by design and site works spent for improving the degree of definite settlement of design.

And since a synthetic drawing efficiently made due to data linkage has an execution settlement added and clearly indicates a part which must be decided by a building site side at an execution stage, the building site side can check mutually various production drawings on the basis of this synthetic drawing and this leads to a smooth construction management.

Since a skeleton drawing can also be automatically made on the basis of said synthetic drawing, the reliability of it is high. As for equipment, data is utilized as an equipment execution original drawing, which is diverted to an equipment execution drawing by a cooperative company and can be utilized in a job in which execution has been started.

By the way, according to a system of the present invention, the sorting by attribute is effective without depending on layer in case that the contents described in a DB are linked to a CAD of an execution system, since the linked contents are reproduced by a CAD software function at the linked side, there is the merit that work can be performed in a layer configuration convenient for the linked side regardless of the layer configuration at the original CAD software side. The original CAD software side can also do with a layer configuration convenient to itself and does not need to consider the layer configuration of the linked side. The linkage through DB has a merit that it can be performed regardless of layer configuration.

In addition to said action, the system performs superposition of plans by a two-dimensional CAD software product, superposition of plan sections and elevation sections at predetermined positions by a three-dimensional CAD software product and further new superposition of three-dimensional objects by a three-dimensional CAD software product, said superposition having been used up to now as means for securing the compatibility; and the three-dimensional superposition has the following merits.

(1) A three-dimensional system makes it possible to examine and confirm the compatibility and the like from an optional direction.
(2) A system for accurately estimating the quantities needs originally to be three-dimensional.

The present invention makes it possible to immediately find incompatibility by viewing a part to be verified from an optional direction out of 360°.

A conventional superposition method of plan sections and elevation sections cut out by a three-dimensional CAD has specified in advance the positions of sections to be superposed, cut out these sections by CAD's of the respective systems and then checked the superposed part.

However, this method takes a long time for prearrangement and further, in case that an irrational and questionable part appears, it is necessary to repeat the same method in order to check a section taken along another direction and, therefore, this method has been inefficient due to needing double labor.

The present invention provides and reproduces three-dimensional information as data of DB or data in the IFC format from building and equipment DB's to a three-dimensional building CAD.

Due to this, it is possible to confirm the superposed state of building, structure and equipment from any direction on a three-dimensional building CAD.

Further, in comparison with the case of cutting out and superposing said predetermined sections, it is possible to take the contents of structure and equipment as three-dimensional objects into a three-dimensional building CAD by simply reading three-dimensional data of structure and equipment and, therefore, the prearrangement is made remarkably labor-saving and it is not necessary to repeatedly check.

Furthermore, since data with attribute of structure and equipment is taken into a three-dimensional building CAD, it is possible to take in only necessary information for checking the compatibility, check interference by means of attribute and easily check the interference of parts difficult to judge by only viewing a display screen.

Thus, although building, structure and equipment CAD's are based respectively on different CAD software products, they are kept compatible with one another on DB's.

A second feature of the present invention provides as its purport an integrated building production information system, wherein a design CAD makes a building model virtually reproducing a building to be actually built after now inside a computer software product using a personal computer-based three-dimensional CAD programmed so that a shape made on CAD software and an attribute being its own property are linked with each other on the CAD software, and stores building specifications such as the specifications, dimensions, quantities, heights and the like of a structural skeleton, finish, fittings, equipment piping, ducts, and machines and instruments as attribute data into the shared database.

According to the present invention, in addition to the action of said first feature, differently from a conventional two-dimensional CAD simply drawing lines, since a design CAD makes a virtual building model (virtually reproducing a building to be actually built from now in a piece of computer software) by means of a personal computer-based three-dimensional CAD having an object function (programmed so that an object drawn on a piece of CAD software behaves having an attribute being its own property within the CAD software) and has such attributes as the specifications, dimensions, quantities, heights (position information) and the like of a structural skeleton, finish, fittings, equipment piping, ducts, and machines and instruments stored in a shared database, by reading and reproducing the information by means of the CAD software of the execution side it is possible to reproduce attribute information as well as pattern information, save a labor of repetitive input, and continue working in a layer configuration convenient to its own CAD software.

The linkage of a shape made on such object-oriented CAD software to its attribute in the CAD software means that when the shape is changed the quantity is also changed at the same time.

For example, a building has a wall and in case of providing a window in this building, the window has the property of making a hole in the wall. And the linkage is a sequence of changes that when the window is changed in size the hole is also changed in size (the wall is also changed in area).

In case of equipment, for example, in case of piping, the linkage has use, piping material and size as attribute, and in case of branching, it generates a joint having a shape adapted to its material and size and makes it impossible to join pipes having different uses with each other.

In case of structure, the linkage is as follows.

1. Since there is information what floor columns and walls belong to, when the floor height information is changed all of the columns and walls are automatically changed in height.
2. Since the relation of connection between members is recognized, for example, when a column is changed in size, a beam attached to the column is automatically changed in length adaptively to movement of the column face.
3. When the shape information of a member section symbol is changed, all members arranged with this symbol are recognized with a new shape.

In case of two-dimensional CAD, two-dimensional plane data are superposed and the incompatibility in height has been judged by a person. In order to make this easy to do, there has been performed a contrivance for making it easy to find the incompatibility in height by performing a layer classification by height information, giving symbols to and classifying in advance layers such as a ceiling surface, ceiling inside, wall surface, floor surface and the like, and performing a layer change on the superposed drawings. In case of three-dimensional CAD as well, in case that the respective systems use different three-dimensional CAD's, it has been performed that the sections to be superposed are predetermined in position, the predetermined sections are made by the respective three-dimensional CAD's, their data are superposed on each other and thereby the compatibility is confirmed.

The present invention makes it possible to confirm the compatibility from an optional direction in a short time by newly superposing three-dimensional objects as they are as a means for storing compatible information.

And it is possible to check the interference, utilizing attribute information without performing a layer change.

Further, a system of the invention makes it possible to reproduce attribute information as well as pattern information, save a labor of repetitive input and continue working in a layer configuration convenient to its own CAD software by reading and reproducing information stored in a shared database by means of a CAD software product of the execution side.

A third feature of the present invention provides an integrated building production information system having the following matters as its purport.

Databases are built in the outside separately from design CAD's and these design CAD's are based on building, structure and equipment software products.

The databases make it possible to grasp and share the quantities by sorting data of a standard database into character information and pattern information by means of a design CAD on a personal computer, unify specifications and quantities and unify data flows from design information to estimation and execution information.

The invention makes an integrated DB-CAD database of building, structure and equipment as an execution-linked system in DB-CAD's, and links and integrates with one another the database CAD's comprising three DB-CAD's including a building DB-CAD related to finish, fittings and the like, an equipment DB-CAD related to machines and instruments, piping, ducts, wiring and the like, and a structure DB-CAD related to columns, beams, slabs and the like.

Between the building DB-CAD and the equipment DB-CAD, a means for linking and integrating these DB-CAD's with one another provides equipment 3-D information (three-dimensional information of equipment) from the equipment DB-CAD to the building DB-CAD, returns 3-D interference information from the building DB-CAD to the equipment DB-CAD, and provides plan information (plan drawing, room area, room name, ceiling height and floor height) and skeleton information such as building shape information, building member information, building section information and the like at the beginning of making drawings, between the structure DB-CAD and the equipment DB-CAD, said means provides such skeleton information as building shape information, building member information, building section information and the like from the structure DB-CAD to the equipment DB-CAD, and returns skeleton opening (sleeve) information such as information of making a hole in said skeleton information from the equipment DB-CAD to the structure DB-CAD, and between the building DB-CAD and the structure DB-CAD, said means transfers reciprocally such skeleton information as building shape information, building member information, building section information and the like, and confirms mutually such skeleton information.

A fourth feature of the present invention provides as its purport an integrated building production information system for realizing the linkage of data between different CAD software products, further transferring reciprocally data described with character information (DB information), realizing the exchange of three-dimensional data with attribute, and making the information reading CAD side reproduce the attribute and pattern on the basis of this information.

The present invention having the third and fourth features, intending to realize the data linkage between different CAD software products, makes it possible to take in information and secure the compatibility by means of a method which performs the guarantee of compatibility and the unification of data, makes a means of three-dimensional superposition, and, therefore, reciprocally transfers data described with character information (DB information) and realizes the exchange of three-dimensional data with attribute and makes the data reading CAD side reproduce the attribute and pattern on the basis of the information.

The linkage of the building DB-CAD with the structure DB-CAD make it possible to secure the compatibility of skeleton; the linkage of the building DB-CAD with the equipment DB-CAD makes it possible to confirm and secure the compatibility of the contents of equipment with a building plan, and reproduce a building plan at the start of drawing figures; and the linkage of the structure DB-CAD with the equipment DB-CAD makes it possible to reproduce the skeleton at the beginning of drawing figures and return the skeleton opening information to the structure DB-CAD.

BRIEF DESCRIPTION OF THE DRAWINGS

FIG. 6 is an explanatory diagram showing output and adjustment of the reference origins and centers.

FIG. 8 is an explanatory diagram showing output and adjustment of the reference origins and centers in case that the relation between this side model and the other side model is not one-to-one.

BEST MODE FOR CARRYING OUT THE INVENTION

Figure 1:
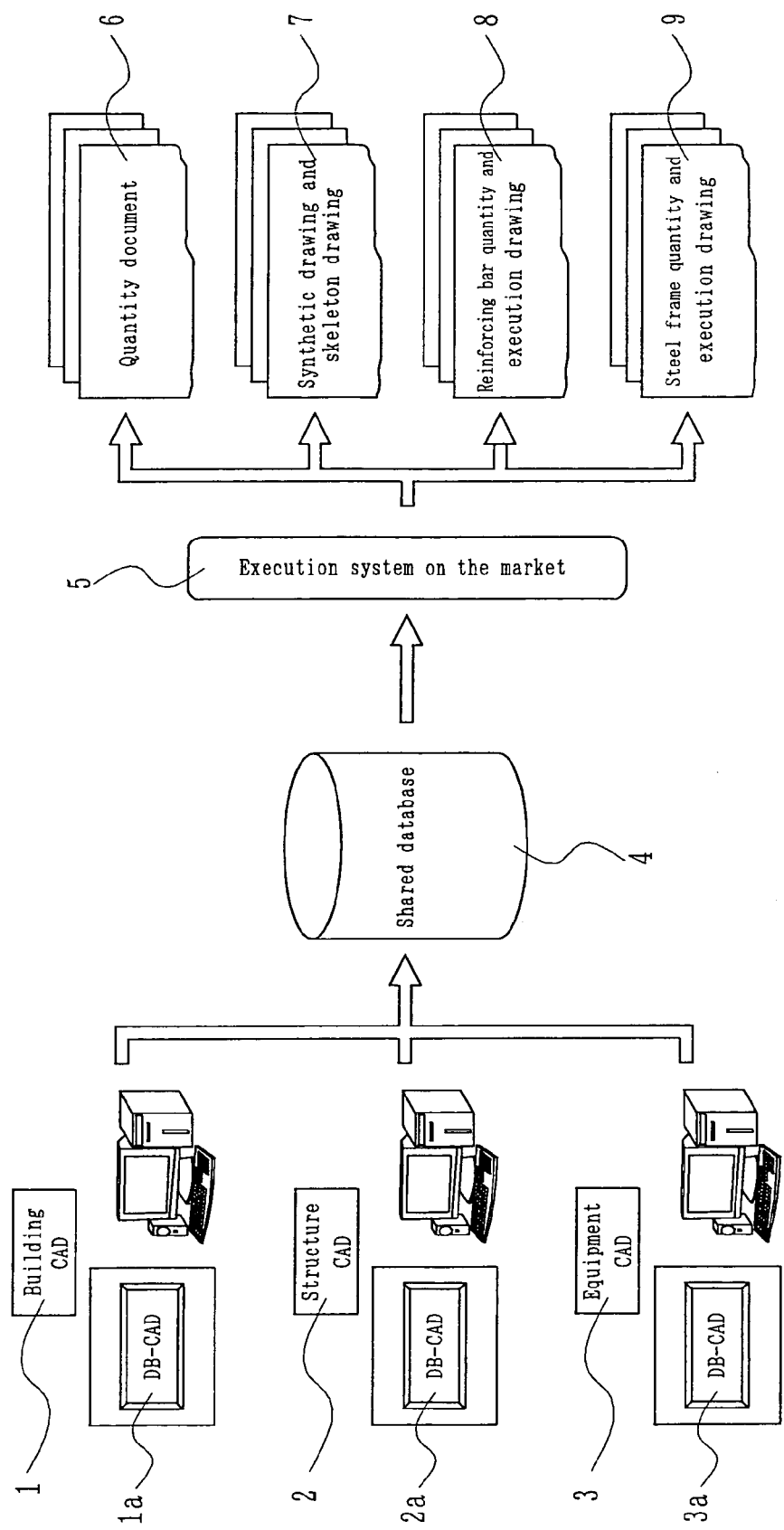
FIG. 1 is an explanatory diagram showing an embodiment of an integrated building production information system of the present invention.

An embodiment of the present invention is described in detail with reference to the drawings in the following. FIG. 1 is an explanatory diagram showing an embodiment of an integrated building production information system of the present invention, and numbers 1, 2 and 3 in this figure are respectively a building CAD, a structure CAD and an equipment CAD as design CAD's, and are based on different software products according to their respective features.

There are provided databases DB-CAD (building) 1a, DB-CAD (structure) 2a and DB-CAD (equipment) 3a built in the outside separately from these design CAD's including building CAD 1, structure CAD 2 and equipment CAD 3.

Taking building CAD 1 and DB-CAD (building) 1a as an example, the exchange of data between a CAD and an external DB is ordinarily performed as text data obtained by being converted into the CSV (comma separated value) format, and an interface making it possible to directly write/read from building CAD 1 to a specific DB-CAD (building) 1a utilizing the Access Link function of specific software is used.

In this way, it is intended to directly link with each other the design work extending from planning to basic execution and the estimation, ordering and execution drawing preparation jobs in associated systems utilizing attribute functions of DB-CAD (building) 1a on a personal computer. That is to say, data of openings, finish and the like stored in a specific DB-CAD (building) 1a can be not only outputted to various rough estimation systems in a design department or a fittings table and a finish table but also utilized in various systems in an estimation or execution department at the lower stream side.

By taking out a part having an RC attribute from a design model, the design model can be utilized as a skeleton drawing preparation model, but the effect of attributes possessed by an object in this DB-CAD (building) 1a is in that building elements such as columns, beams, openings and the like are collected and various attributes such as areas, specifications and the like are stored in a specific DB due to a fact that building CAD 1 is linked with the specific DB. Therefore, when a model corresponding to each stage of design has been made, at the same time it is possible to grasp a floor area, finished areas of a wall, ceiling and the like, and the quantity of parts and further rough estimation and the like. A designer can advance a rational design meeting the requirements of a customer as considering these data. On the other hand, an estimation department can effectively utilize these numerical data. It is possible not only to directly input these data into an estimation system but also to utilize them in checking data from an estimation office.

As for DB-CAD (structure) 2a, when a drawing is made by structure CAD 2, its drawing information is automatically stored as character data into a DB through a building model, and contrarily when data of the DB is changed, the change is automatically reflected in an associated drawing.

General information of a building, information about materials and member section information out of structural design information of input data contents into DB-CAD (structure) 2a are stored as an ACCESS file at the time of input. On the other hand, information about the shape of a building and the arrangement of members is kept as a three-dimensional model of CAD at the time of an input operation. By keeping the information of arrangement inside a CAD at the time of an input operation, it is possible to realize the compatibility by sharing information between a framing plan and a framing elevation with response at a practical level.

On the other hand, a database in which information about the shape of a building and information about the arrangement of members are stored as a three-dimensional model of CAD at the time of input and structure CAD 2 which outputs the information stored as said three-dimensional model of CAD to a file of said specific format through batch processing at the time of linking with an external system are provided and the whole structure design information is standardized into a fixed form.

According to this DB-CAD (structure) 2a, a structure design department can unify structure design information and pursue the improvement in efficiency of design work by utilizing a skeleton database CAD having files of a specific format of this system being a three-dimensional CAD. And at a design stage, the result of planning is automatically inputted into a skeleton database and thereby, original data for a structure computation can be generated. Since the compatibility between various drawings of structural design and structural computation can automatically be obtained through a three-dimensional model of CAD and a skeleton database, the efficiency of design work can be improved.

As output drawings, there are a framing plan, framing elevation (automatically made) and a detailed reinforcing bar drawing (automatically made), and additionally, there are a detailed steel frame drawing (automatically made), a section list (semi-automatically made) and a skeleton DB output, and further there is also prepared a layout function for making various mixed drawings.

And DB-CAD (equipment) 3a is composed of equipment CAD 3 for preparing equipment drawings and a DB combined with each other, inputs and stores specifications of machines and instruments by means of equipment CAD 3, associates drawing information of a design drawing with machine and instrument information of a specific DB, outputs one or plural pieces of arrangement information of machines and instruments, quantity information of materials and equipment opening information from a design drawing into its own DB, and takes out one or plural pieces of data for drawings, specifications, estimation and execution.

Further, the system passes the information of specifications, arrangement and quantities of machines and instruments and the quantity information of materials as character-based information to an adjustment and estimation system, and diverts a design drawing as pattern (drawing) information to an execution drawing or a completed building drawing.

And DB-CAD (equipment) 3a has a job registering function, a machine and instrument specifications registering and editing function and a various output data preparing function, and equipment CAD 3 has a function of referring machine and instrument specifications information registered at its own DB, a function of linking machines and instruments registered at its own DB with symbols, a function of outputting arrangement information of machines and instruments to its own DB, a function of outputting equipment opening information into its own DB, a function of outputting the quantities of materials, and a function of adding attributes necessary for outputting the quantities.

An integrated DB-CAD obtained by integrating these means stores compatible information into the shared database 4, and further an execution system 5 available on the market receives information of this shared database 4, links the received information to a skeleton drawing CAD or a reinforcing bar and steel frame system on the market for a bill of quantities 6, a synthetic drawing and skeleton drawing 7, a reinforcement quantity execution drawing 8, a steel frame quantity execution drawing 9 and the like.

The shared database 4 has three CAD's including building CAD 1 related to finish, fittings and the like, structure CAD 2 related to columns, beams, slabs and the like, and equipment CAD 3 related to machines and instruments, piping, ducts, wiring and the like, and links and integrates these CAD's with one another.

The present invention links with one another three DB-CAD's including DB-CAD (building) 1a related to finish and fittings, DB-CAD (equipment) 3a related to machines and instruments, piping, ducts, wiring and the like, and DB-CAD (structure) 2a related to columns, beams and slabs, as described above.

Figure 5:
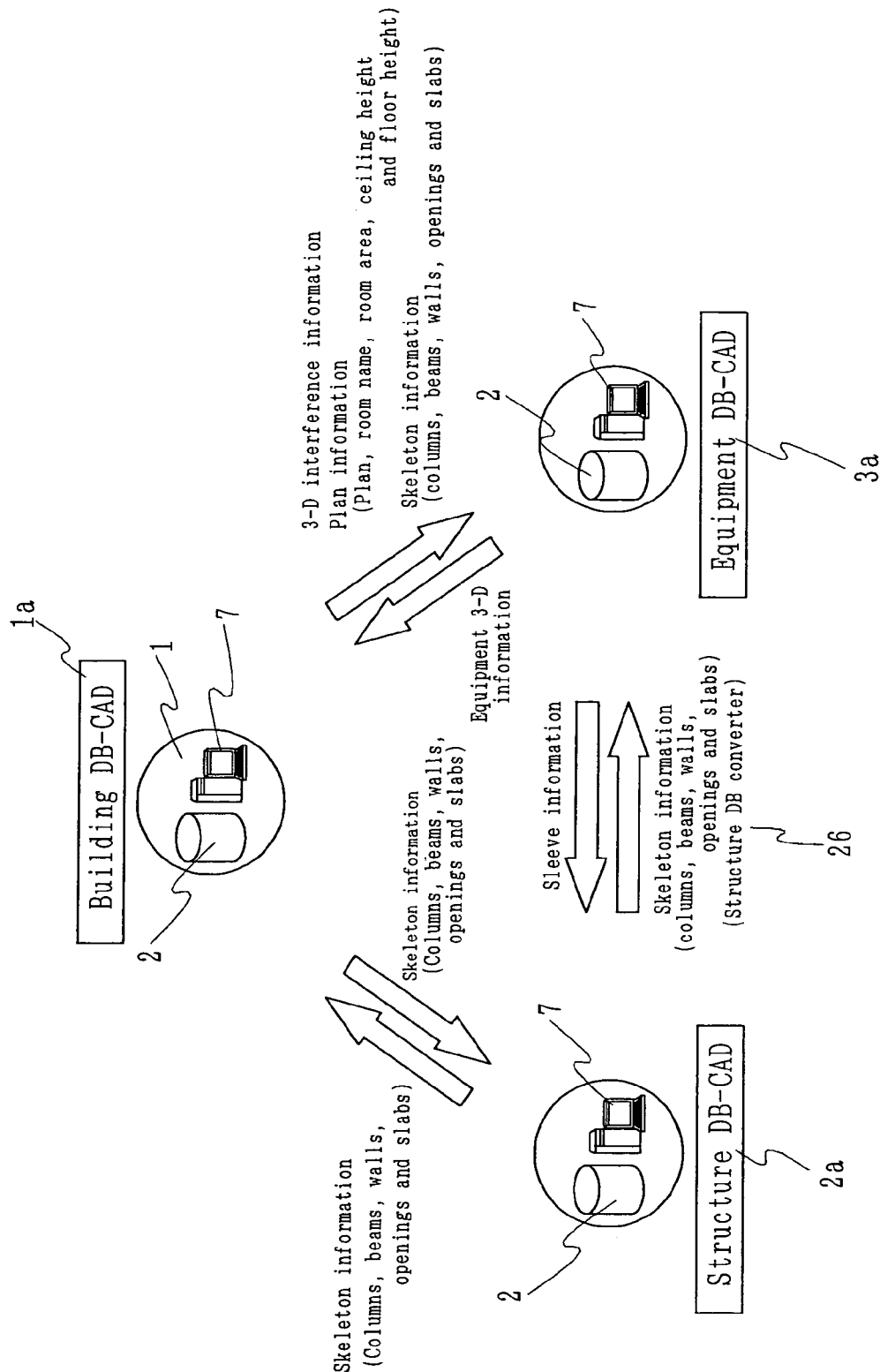
FIG. 5 is an explanatory diagram showing the flow of information of an integrated database CAD system of building, equipment and structure.

As shown in FIG. 5, between DB-CAD (building) 1a and DB-CAD (equipment) 3a, this mutual linkage provides equipment 3-D information (three-dimensional information of equipment) from DB-CAD (equipment) 3a to DB-CAD (building) 1a and returns. 3-D interference information from DB-CAD (building) 1a to DB-CAD (equipment) 3a, and provides plan information (plan, room area, room name, ceiling height and floor height) and skeleton information such as building shape information, building member information, building section information and the like at the beginning of making drawings.

Between DB-CAD (structure) 2a and DB-CAD (equipment) 3a, this mutual linkage provides skeleton information such as building shape information, building member information, building section information and the like from DB-CAD (structure) 2a to DB-CAD (equipment) 3a and returns skeleton opening (sleeve) information such as information of making a hole in said skeleton information from DB-CAD (equipment) 3a to DB-CAD (structure) 2a, and between DB-CAD (building) 1a and DB-CAD (structure) 2a, this mutual linkage exchanges skeleton information such as building shape information, building member information, building section information and the like, and makes them mutually confirm this skeleton information.

In such linkage, how to handle attribute data is the key. For example, in a column configuration, a set of 4 segments seen by human eyes can be recognized as a column function, but is considered simply as a set of lines or a tetragon on CAD. The present invention makes it possible to identify the kind, material, size and the like of a column by providing it with attributes as CAD.

How to read individual objects from a database is performed with center information as the center. The compatibility is secured by reading in such a way, and then the structure side is limited to columns, beams, slabs and the like which it is in charge of, and the equipment side is limited to the range of responsibility of it including electric equipment, sanitary equipment and air conditioning equipment. In relation to matters other than these, individual objects are transferred to and from the building side.

As described above, it is necessary to realize the exchange of three-dimensional data with attributes through transferring data described with character information (DB information) and make the reading CAD side reproduce the attributes and patterns on the basis of this information.

In order to do so, it is necessary to make objects coincide with one another in positional relation, and for this purpose, the reference origin and center are outputted and adjusted. Each system outputs all information of center (symbols, and the coordinates of the starting point and end point). It outputs the center information for each drawing.

The reading side determines definitely the position of center and vector of the opposite party from the points of intersection of three centers of the opposite party (two parallel lines and one line crossing them, for example, X1, X2, Y1), and adjusts and arranges members comparing them with its own center. This correspondence is applied, for example, in case that a building side and a structure side respectively make models in a one-to-one correspondence.

As shown in FIG. 6, on the assumption that the centers for describing a building such as X1, X2, X3, X4, X5, Y1, Y2 and Y3 exist on actual data, the system writes out these data, determines the starting point in positional relation, for example, takes out optional three lines of X1, X2 and Y1 and identifies the coordinates of the points of intersection, compares the coordinates of the points of intersection with the data actually written there in a program, finds the relative positions existing on the opposite party's database and makes them correspond to X1, X2 and Y1 in its own system, and computes and outputs the relative positions of these points as the result of computation on the program.

Figure 7:
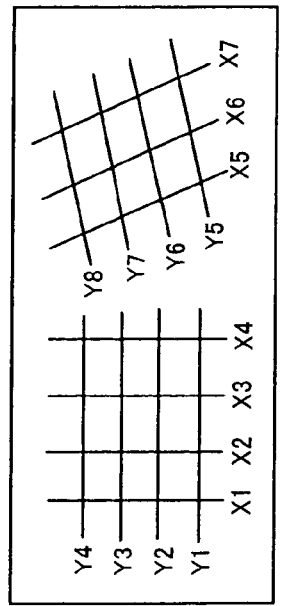
FIG. 7 is an explanatory diagram showing output and adjustment of the reference origins and centers in case that the centers are separate.
Figure 9:
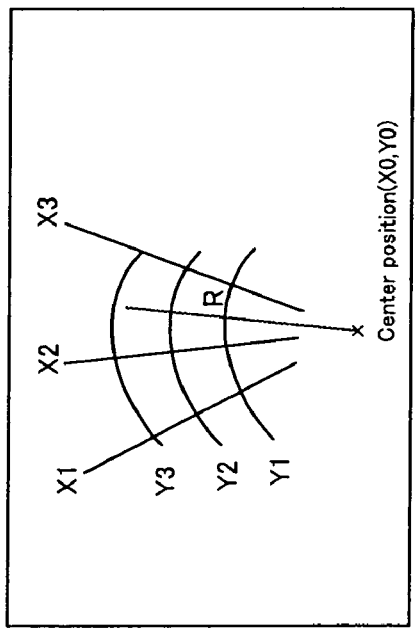
FIG. 9 is an explanatory diagram showing output and adjustment of the reference origins and centers in case that the centers each are in the shape of a circular arc.

Even in case that the centers are separated as shown in FIG. 7, since they are one in data, if optional three lines are taken out, there is no problem, and even in case that the relation between its own model and the opposite party's model is not one-to-one as shown in FIG. 8, there is no problem if optional three lines can be taken out from each of the models. Further, even in case of the center of a circular-arc shape as shown in FIG. 9, the relative positions can be identified if the center position and radius are identified.

First, the linkage between DB-CAD (building) 1a and DB-CAD (equipment) 3a is described.

As shown in FIG. 5 described above, for checking the interference between building and equipment the system provides equipment 3-D information (three-dimensional information of equipment) from DB-CAD (equipment) 3a to DB-CAD (building) 1a and contrarily returns 3-D interference information from DB-CAD (building) 1a to DB-CAD (equipment) 3a.

Having the interference information returned, said interference information indicating what part and what part interfere with each other in case that the building side reviews objects described in such a form that equipment is reproduced in the DB-CAD (building) 1a side from DB- CAD (equipment) 3a through a database, the equipment side corrects again the defective part.

Concretely, as the linkage of equipment 3-D information to building (DB-CAD (equipment) 3a→DB-CAD (building) 1a), from a synthetic drawing made by DB-CAD (equipment) 3a, the system writes out information including the sizes, coordinates, file names, file paths, figure numbers (ID) and the like of lighting fittings, air conditioning instruments, sanitary instruments, piping and ducts to an equipment 3-D database (EPM-DAT.mdb).

DB-CAD (building) 1a takes these data into DB-CAD (building) 1a and generates data of three-dimensional equipment members. Due to this it is possible to effectively confirm the state of installation of equipment members or check the interference of them with building members on DB-CAD (building) 1a.

A method of making said equipment 3-D data by means of a personal computer is performed in the following manner, for example.

(1) A user makes a synthetic drawing by superposing the respective drawings of electric equipment, sanitary equipment and air conditioning equipment on one another (the synthetic adjustment in equipment has been finished at this point of time).
(2) The user presses the equipment 3-D data making button.
(3) Since a dialog screen appears, the user determines a destination folder by pressing the reference button on the dialog screen.
(4) Next, the user inputs an output file name.
(5) The user inputs a floor name for data to be outputted.
(6) When the preparation has been completed, the user presses the OK button.

Then, equipment 3-D data is made at a specified location. This data is linked with DB-CAD (building) 1a.

Next, describing the linkage of interference information with equipment (DB-CAD (building) 1a→DB-CAD (equipment) 3a), DB-CAD (building) 1a makes it possible to check the interference of equipment members taken in through the 3-D linkage with building members such as columns, beams, walls, ceilings and the like for each region. Further, the system outputs information including the figure numbers (ID), file names, file paths and the like of the equipment members extracted by this interference checking in the form of a text file from DB-CAD (building) 1a to the outside.

For example, it is assumed that there is a screen for receiving MDB of DB-CAD (equipment) 3a of a region where the interference with an equipment member is to be checked as a screen for taking equipment members into DB-CAD (building) 1a.

The user selects "Link/Link with piping ducts/Read equipment DB" of the menu bar and then reads MDB received from a person in charge of equipment design, confirms "Drawing name" and "Floor", and selects "Objective member" to be read.

As a result, a member of DB-CAD (equipment) 3a is arranged on the basis of an optional intersecting point of a center.

A layer screen for taking in an equipment member (electric equipment: CHCK-E, sanitary equipment: CHCK-P, air conditioning equipment: CHCK-M) becomes a screen for indicating the interference checking between an equipment member and a building member, and the user selects "Link/Piping ducts/Interference check" of the menu bar, selects "Building member to be checked" and "Equipment member to be checked", and presses "Interference check". Thus, "Members" and "ID's" of a building member and an equipment member interfering with each other are displayed on "Interference ID" of the screen.

And since an equipment member interfering with a building member on a plan is displayed in red on the screen, when the interfering member is selected on the interference check screen the selected member is also selected on the plan.

On the other hand, describing from the equipment side, it is possible to read interference information also into DB-CAD (equipment) 3a and easily confirm what equipment member of what drawing interferes with a building member.

Describing the outline of a method of taking in 3-D interference data, the method (1) executes an interference data input command reads interference information outputted from DB-CAD (building) 1a and then (2) displays an interference information confirmation screen, and (3) displays the total number of interfering members on each floor in the interference information confirmation screen. (4) An operator selects a floor to be confirmed and presses a confirm button. (5) When the confirm button is executed, drawing data to be confirmed is automatically opened and an interfering member is displayed in a different color. By the above-described operations, an equipment member interfering with a building member can easily be identified by the DB-CAD (equipment) 3a side.

And plan information including a plan, room area, room name, ceiling height, floor height, skeleton information and the like at the start of making drawings is provided from DB-CAD (building) 1a to DB-CAD (equipment) 3a, and the DB-CAD (equipment) 3a side can make drawings on the basis of this information.

Such a linkage of building information to equipment (DB-CAD (building) 1a→DB-CAD (equipment) 3a) makes it possible to cut out plan data (DWG data) of each floor from three-dimensional modeling data made by DB-CAD (building) 1a and put the cut-out data into DB-CAD (equipment) 3a.

An example of a method of taking in plan data is described below.

(1) An operator selects DWG data by clicking an icon for opening a file. In this case, the operator selects DWG drawing (*.dwg) as the kind of a file. When a DWG drawing to be edited is selected, a DWG import screen is displayed, where the operator selects first a conversion table.

After selecting the conversion table, the operator confirms that "Arranged layer" is set at "Building" and then adapts "Paper size" to "Scale", and if the operator clicks "OK" at the time of finishing the setting, a building drawing is opened. Thus, data conversion including integration of layers, unification of line colors and the like is performed so as to make a building drawing for equipment easy to process.

DB-CAD (equipment) 3a is provided with a conversion table for efficiently reading DXF data and CAD We'll data as standard in addition to a DWG import table.

Next, a sheet movement is performed so as to make it possible for DB-CAD (equipment) 3a to recognize room names and room areas taken in from DB-CAD (building) 1a.
(2) The operator selects a layer number and presses "OK".
(3) The operator selects "Setting"—"Sheet function"—"Move and copy" or selects "Move and copy" from a menu displayed by right-clicking on a sheet tab.
(4) Since a dialog screen is displayed, the operator selects mode "Move (M)" and destination "Room area", and presses "OK".
(5) Since "Enter a point you specify" (Enter: the same position) is displayed, the operator presses "Enter" as prompted. Thus, information of a room name and a room area which have been on a base sheet is moved onto a room area sheet.
(6) In a similar manner, a room name being on the room area sheet is moved to a room name sheet. When the operator selects "Setting"—"Sheet function"—"Move and copy" after selecting a character to be moved, the dialog screen described above is displayed, and the operator selects mode "Move (M)" and destination "Room name" and presses "OK". Thus, information of a room name that has been on the room area sheet is moved onto the room name sheet.
(7) Since areas are needed in case that they are used as DB-CAD (equipment) 3a but they do not need to be printed when being outputted, all of them are made into auxiliary figures. The operator selects all sheet tags as keeping the Shift key pressed.
(8) Non-display of a dialog is selected by right-clicking the mouse in a state where a sheet tag is displayed reverse-video in black.
(9) Since only a selected sheet can be edited, only a room area is displayed by clicking a tag of the room area sheet.
(10) The operator selects "Setting"—"Color, line"—"Change" in the menu. Since "Select a figure" is displayed, the operator encloses and selects all figures with the mouse and then presses "Enter" on the keyboard.
(11) Since an attribute change dialog is displayed, the operator selects an auxiliary figure line from a list of line kinds and presses "OK". The room area is made into an auxiliary figure by the above operations.

Taking in building information with IFC data is performed by outputting skeleton information including room areas, room names, ceiling heights, floor heights, columns, beams, slabs, walls and the like made by DB-CAD (building) 1a as IFC data and reading these data into DB-CAD (equipment) 3a.

IFC (Industry Foundation Classes), which presents the definition of specifications of a systematic representation method and the data structure of a project model for handling objects (elements such as doors, windows, walls and the like for example) to form a building among different systems, is a world-standard data structure.

Thanks to this, it is possible to collectively take data of ceiling, floor, room area and room name in addition to data of column, beam, slab and wall linked with a structure DB-CAD up to now into DB-CAD (equipment) 3a from DB-CAD (building) 1a. As shown in FIG. 5, the linkage between DB-CAD (structure) 2a and DB-CAD (equipment) 3a provides skeleton information through a structure DB converter 26 from DB-CAD (structure) 2a to DB-CAD (equipment) 3a, and generates a three-dimensional structural skeleton drawing in a CAD for preparing equipment drawings of DB-CAD (equipment) 3a. The structure DB converter 26 plays a role of generating a structural skeleton on an equipment CAD.

Concretely describing, in case of the linkage of structure data to equipment data (DB-CAD (structure) 2a→DB-CAD (equipment) 3a), data of column, beam, slab and wall made by DB-CAD (structure) 2a can be taken into DB-CAD (equipment) 3a by being converted by the structure DB converter 26.

An operation of conversion of the structure DB converter 26 is described.
(1) An operator starts a "skeleton converter" and specifies a drive, directory and object on a taken object specifying screen.
(2) The operator selects a model to be an object and presses the OK button.
(3) Next, the operator specifies necessary floor data.
(4) The operator specifies a drawing number in a drawing name specifying dialog.
(6) The operator confirms the specified information. Subsequently to "Conversion—drawing number—name", the operator specifies a drawing and presses the OK button when the specification is finished.
(7) A dialog of being under preparation of an intermediate file is displayed. When the conversion is ended, an information setting dialog is displayed. The operator enters a person in charge in the dialog and specifies a location where a converted file is to be stored to an output device. Further, the operator gives an object code. The operator confirms the paper size and scale through a structure designer in advance, and specifies them. The operator places a check on the file selection in an attribute conversion table, and selects "For DB-CAD" as the file.
(8) "Conversion completed" is displayed.
(9) Since the process is returned to the initial screen, in case of ending the process the operator selects "File"—"End".
(10) The operator starts Explorer. The converted data is generated under D:¥Drawfile¥Itoen¥. (Extension.dwx)

Describing how to take in structure data, structure data converted by the structure DB converter 26 is read by DB-CAD (equipment) 3a.
(1) An operator selects DWX data by clicking an icon for opening a file. In this case the operator selects a DWX drawing (*.dwx) as the kind of a file.
(2) When a DWX drawing to be edited is selected, a Cadwell import screen is displayed. Hereupon, the operator selects first a conversion table. The operator selects a table name WELTABLE.wet. After selecting the conversion table, the operator confirms that "Arranged layer" is set at "Building", and then adapts "Paper size" to "Scale". When the setting is finished, a structure drawing is opened by clicking "OK".

By the above-mentioned operations, a work for taking data made by DB-CAD (structure) 2a into DB-CAD (equipment) 3a is completed. These data are superposed on a building drawing on the basis of a reference point. Since structure data are not needed at the time of paper-outputting, all of them are made into auxiliary figures.

On the other hand, the operator returns sleeve or equipment opening information such as information of making a hole in said skeleton information from DB-CAD (equipment) 3a to DB-CAD (structure) 2a.

When the operator writes a drawing of equipment into a drawing of said three-dimensional structural skeleton, the operator returns opening information (sleeve information) of piping or a duct in a beam, floor and wall to DB-CAD (structure) 2a and examines some reinforcement of the opening.

In another manner, the operator writes a sleeve into a steel frame section called a framing elevation being in DB-CAD (structure) 2a. The operator makes the equipment side read again the information of sleeve and opening outputted from DB-CAD (equipment) 3a and writes a beam sleeve into its framing elevation and thereby can perform checking.

More concretely describing the linkage of such sleeve or equipment opening information to structure (DB-CAD (equipment) 3a→DB-CAD (structure) 2a), a procedure of preparing sleeve or equipment opening information comprises the steps of 1) preparing a building drawing for drawing a sleeve or equipment opening figure; 2) arranging sleeves or equipment openings (preparing a synthetic sleeve drawing of electric, sanitary and air conditioning equipment); 3) setting drawing information (setting a drawing path, a sleeve path and the like); 4) adding information of sleeve division (equipment division and class); and 5) outputting sleeve or equipment opening information (making SL-DAT.mdb).

A drawing information setting method comprises the steps of (1) starting a job by setting air-conditioning equipment or sanitary equipment in menu "Setting"—"Equipment change", (2) opening a sleeve or equipment opening information output drawing file by means of menu "File"—"Open" or icon "Open", (3) displaying dialog "Equipment DB-CAD drawing information" using icon "Drawing information setting", (4) specifying necessary items including "Equipment DB path", "Structure DB path", the kind of drawing and the like, where the kind of drawing is a sleeve drawing, and (5) pressing button "Refer to structure DB", referring a structure DB and making it possible to confirm a floor order in order to specify "Floor" and "Floor order".

Describing a sleeve or equipment opening data preparing method, this method comprises the steps of (1) displaying dialog "Member insertion" by means of menu "Air conditioning"—"Member"—"Insert" or icon "Equipment and member insertion"; (2) selecting tag "Sleeve", entering necessary items including a member to be inserted, class 1 or 2 facing and the like and pressing the "OK" button; (3) specifying the position of insertion since "Specify the position of insertion (straight pipe)" is displayed in a command input bar; (4) specifying the end point since "Specify the end point (straight pipe)" is displayed in the command input bar; (5) determining the direction and pressing "Enter" since "Determine the direction (Enter: end of selection and Shift+ left click: change)" is displayed, where thus a sleeve is inserted; (6) next, pressing icon "Addition of sleeve division"; (7) selecting a sleeve and then pressing "Enter" since "Select a sleeve to have division added" is displayed, where an ID number is automatically assigned to the sleeve; (8) checking the equipment division and class of the selected sleeve since dialog "Equipment DB-CAD sleeve division" is displayed, where the sleeve having an equipment division specified has the equipment division and class displayed by auxiliary graphic characters as shown by M(S) at the right bottom; and (9) invocating a check command and specifying "Sleeve check" of the fourth item in case of attempting to check the addition of sleeve information, where a sleeve having no sleeve division information added after executing the command is displayed in red, and all checked members have the information added; and

(10) saving a drawing after making the drawing has been finished completely, where simultaneously with saving the drawing, the sleeve or equipment opening information is written into a database (SL-DAT.mdb) being on the equipment DB path specifying the sleeve information.

Describing a sleeve or equipment opening data outputting method, this method comprises the steps of (1) activating a machine and instrument DB, selecting "Sleeve or equipment opening output" from a menu for editing an objective work and displaying dialog "Sleeve or equipment opening output"; (2) specifying a location where data is to be saved and pressing the "Execution" button since a dialog is displayed; (3) pressing the "Yes" button, if satisfied, since a confirmation message is displayed; (4) pressing the "OK" button since an end message is displayed, where the edit menu screen comes back and the output job is ended. This method lets a skeleton drawing preparation CAD or a steel frame CAD read a database file (SL-DAT.mdb) made by the above-mentioned job and automatically generates sleeve or equipment opening information.

An operation of making a framing elevation is performed by analyzing a sleeve or equipment opening database (SL-DAT.mdb) made by DB-CAD (equipment) 3a and automatically superposing sleeve data on the framing elevation.

A framing elevation making method is composed in the following manner. (1) The method opens a framing elevation made by DB-CAD (structure) 2a. A structure DB has a systematized folder configuration for storing various data. Data of a framing elevation are stored as DWG data in a FRAME folder under a MODEL folder. (2) The content of LAYFRM*.dwg is described in Drawing.mdb in an MDB folder. (3) A certain dialog is opened by double-clicking Drawing.mdb. The method opens PlanFrameTbl in this. (4) The operator can confirm the relation between DWG file name (FrameNo) of a drawing and the drawing name (what number of framing elevations?) by means of this table. All the DWG file names in this table are described by names of three-dimensional data. A drawing is selected by substituting these data names for two-dimensional data names. For example, in a drawing of the lower figure, a D-center framing elevation is described as FRAME7.dwg but in this case, data opened by equipment is LAYFRM*.dwg. (FRAME.DWG and LAYFRM*.dwg correspond to each other on a one-to-one base. (5) When the content can be confirmed, the framing elevation of a structure to be an object is opened. (6) A framing elevation making command is executed.

(7) A sleeve DBpath and a structure DB path are specified. i) The sleeve DB path specifies a folder set in a drawing information setting screen of a sleeve drawing. ii) The structure DB path specifies an MDB folder of a structure DB converted for a sleeve drawing. The operator specifies a folder by pressing a reference button and, if the setting is performed, presses "OK".

(8) The sleeve data of each floor corresponding to a relevant axis appear on a screen. The operator operates the mouse and specifies a reference point of arrangement at the intersecting point of an FL line in the lowest floor and the leftmost center in the framing elevation. By the above-mentioned operations, sleeve information of each floor made by the equipment DB-CAD is superposed on the specified framing elevation.

A procedure of linkage of "equipment→structure" outputs data of a skeleton penetrating region such as a piping, duct and the like inputted by a person in charge of equipment using equipment DB-CAD. In these data there are described positional information of regions where piping, ducts and the like penetrate the structural skeleton and the shapes and sizes of the skeleton penetrating holes in relation to the whole building.

When a person in charge of structure specifies the appropriate file by means of an "Equipment through-hole data input" command, the above-mentioned information is described in the key frames of the structure DB-CAD and the equipment through holes are automatically drawn on a framing plan and a framing elevation.

In the linkage between DB-CAD (building) 1a and DB-CAD (structure) 2a, the system mainly transfers reciprocally skeleton information (building shape information, building member information, building section information and the like) [structural skeleton part] and finally performs "Superposition" and thereby checks whether or not the respective pieces of skeleton information coincide completely with each other.

The structural skeletons called by both of the building and structure sides are different from each other in that the skeleton of the building side is more decorated in comparison with the skeleton of the structure side. For example, the building side must consider the existence of facing concrete or finishing concrete on a wall surface and further consider such details of an opening as the fit of a sash and the like, but it is enough as the structure side to consider simply the existence of a large hole. The building side considers in more detail.

Describing in more detail, DB-CAD (building) 1a reads and superposes information of DB-CAD (structure) 2a on the skeleton itself written by DB-CAD (building) 1a.

For example, a part drawn by the building side itself is red and apart taken from the structure side is blue, and a figure obtained by superposing them on each other is the figure having structural information that is also superposed on it on the building DB-CAD.

Details are treated more preferentially at the building side, and since parts related to finish are regardless of the structural skeleton, a red part appearing on a floor is a part having floor finish added to it.

A thin red part called "facing" of concrete of a wall, said thin red part appearing on the surface, can be checked in detail, where facing called by the building side is properly and clearly shown.

On the other hand, in case that DB-CAD (structure) 2a side obtains information from the DB-CAD (building) 1a side, a red line in a figure composed in a screen is the core of a wall and there are yellow lines of the wall around the core, and a red part is a part on which a part from DB-CAD (building) 1a is superposed and this part has an opening such as a window and the like closely to C1, which opening is slipped and incompatible between the building side and the structure side.

Basically, this shows a check drawing for the purpose of correcting a structure as collating a window slightly changed in size or position with the structure in course of boiling down the design rather than a drawing in which the window is incompatible in position.

A person in charge of building outputs a three-dimensional building model inputted from the building DB-CAD as an IFC file.

The person in charge of building takes in information of an IFC file of building by means of a "Building model input" command of the structure DB-CAD.

As a result, member information (columns, beams, walls, wall openings, slabs and floor openings) of a building in the range of building defined by the structure DB-CAD is taken into the structure DB-CAD, and the figure of each member is automatically drawn by means of building information in each floor framing plan of the structure DB-CAD on the basis of member data of building. This figure drawing operation draws figures on a layer for building data of each floor framing plan differently from the case of input by the original structure DB-CAD.

Thus, although a conventional method has been required the work of outputting a plan of each floor as a drawing file of the floor from a model inputted by the building side and superposing the drawing file on a framing plan file of the building DB-CAD for each floor, this function of taking in a building model enables building information of all the floors of a building to be displayed in a state where only necessary pieces of information for collation with a structure drawing are accurately superposed on each other by a single take-in instruction, and, therefore, a work of securing the compatibility of information between the building and structure sides is made greatly efficient.

After a take-in operation has been finished, a person in charge of structure opens a framing plan of each floor, makes a "Building member display" command display the above-mentioned drawing and visually checks whether or not a building member is compatible with a structure member already inputted by a command of the structure DB-CAD. Since information regardless of structure such as information of wooden partitions and the like has also been displayed up to now, the collation of members has needed a long time but this function has improved the visual perceptibility by displaying only structural skeleton information out of building information.

In case that a piece of building information and a piece of structure information are incompatible with each other, a structure member is often corrected adaptively to the building information, but in case of making the building information have priority, a person in charge of structure reports a location where the incompatibility occurs and the content of the incompatibility to a person in charge of building and confers with the person in charge of building on a measure to be taken.

As for wall openings, the person in charge of structure takes building opening information into a three-dimensional model of the structure DB-CAD by means of a "Building opening information input command, displays the building opening information on a framing plan and a framing elevation, collates this information with structural opening information already inputted and, if there is no problem, substitutes the building opening for the structure opening. A method of substitution can be selected from methods by individuals, plurals, all, each floor, plural floors and the like. According to this, the operator substitutes the wall opening arrangement data of the skeleton DB for the wall opening data of a key frame (three-dimensional model) of the structure DB-CAD and adds the substituted data to a wall opening section list of the skeleton. DB. Thus, the compatibility of information between the structure design drawings and the building design drawings can be easily realized.

Further describing a linkage system of building with structure, as an example, on a screen an operator receives MDB of DB-CAD (structure) 2a from a person in charge of structure design and selects "Link/Structure DB link/Structure DB read" of a menu bar.

The operator reads MDB received from the person in charge of structure design, confirms "Structure DB file" and "Floor" and selects "Objective member" to be read, and inputs OK.

A positional adjustment is performed on the basis of information of the respective centers of building and structure, and a hatched (painted) part of a structural member to be arranged, namely, taken in is displayed in blue, for example.

In order to check the interference of a structural member with a building member, the operator selects "Link/Structure DB link/Interference check" of the menu bar, selects a member to be checked and presses the "Interference check" button, and then a building member and a structural member interfering with each other and the result of checking are displayed in "Interfering member ID".

On the screen, a structural member interfering with a building member on a plan is displayed in red, for example.

In a three-dimensional display, the external shape line of a structural member is displayed in red.

In case that an opening is incompatible (different in position and size), a wall where the incompatible opening exists is displayed in blue, for example.

When the operator selects an interfering member on the "Interference check" screen, the selected member is selected on the plan as well. The operator confirms the interfering part on the screen as "Check result" and confers with a person in charge of structure design on a measure to be taken.

Figure 4:
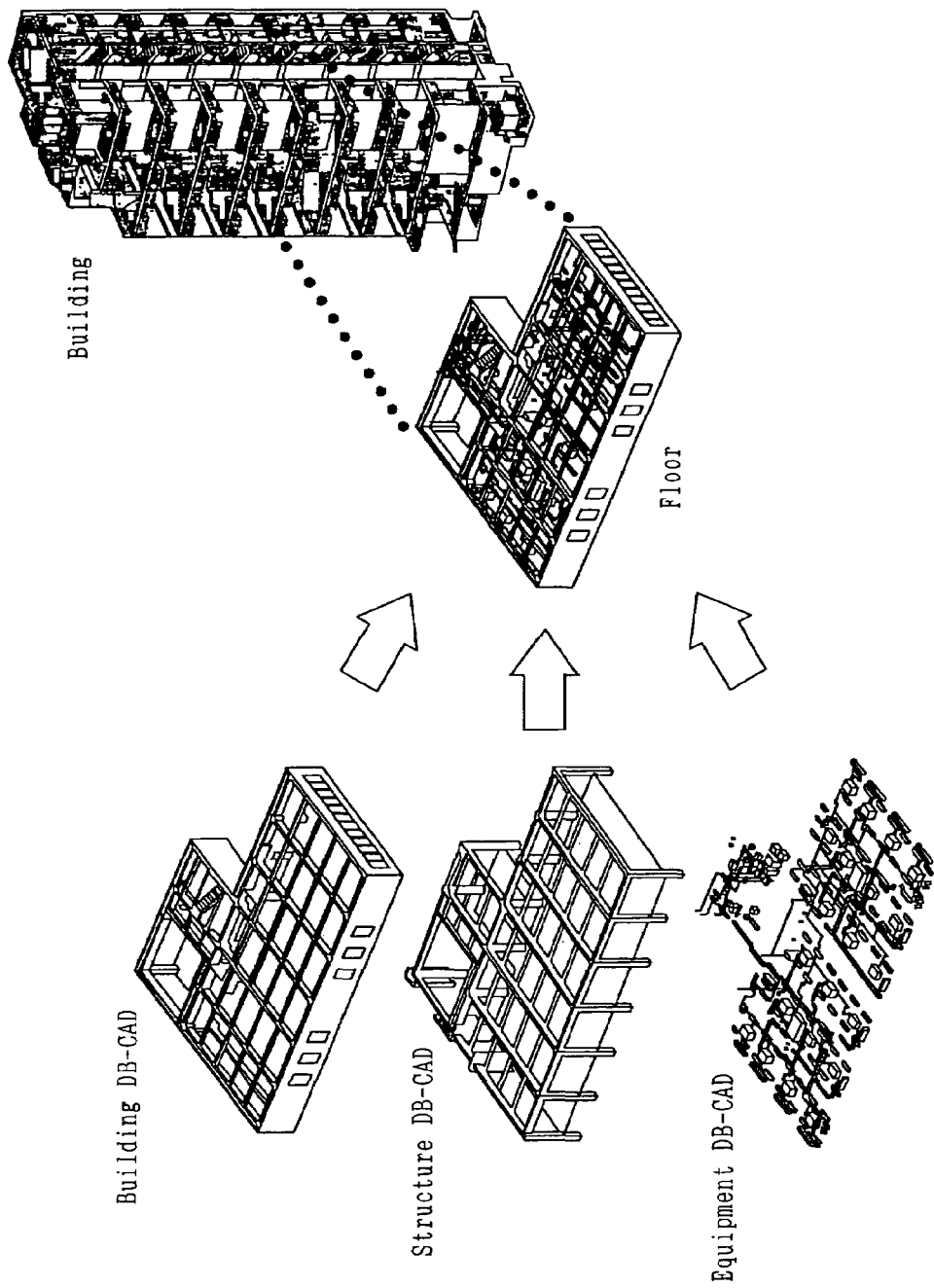
FIG. 4 is an explanatory diagram of the confirmation of compatibility.

In order to realize the linkage of data among three different DB-CAD's including DB-CAD (building) 1a, DB-CAD (structure) 2a and DB-CAD (equipment) 3a, it is necessary to store compatible information, where the superposition of plans by two-dimensional CAD software, the superposition of plan sections and elevation sections at a predetermined position by three-dimensional CAD software, which superposition has been performed up to now, and additionally the new superposition as three-dimensional objects by three-dimensional CAD software are performed. FIG. 4 shows such confirmation of compatibility (superposition of data), which three-dimensionally performs display/checking.

In order to store said compatible information, it is possible to take in information and secure the compatibility of the information taken in by a method of reciprocally transferring data described with character information (DB information), realizing the exchange of three-dimensional data with attributes and making the reading CAD side reproduce an attribute and pattern on the basis of that information.

The linkage of building with structure makes it possible to secure the compatibility of skeleton; the linkage of building with equipment makes it possible to confirm and secure the compatibility of the contents of equipment with a building plan and reproduce the building plan at the beginning of drawing figures; and the linkage of structure with equipment makes it possible to reproduce a skeleton at the beginning of drawing figures and return skeleton opening information to the structure side.

Figure 2:
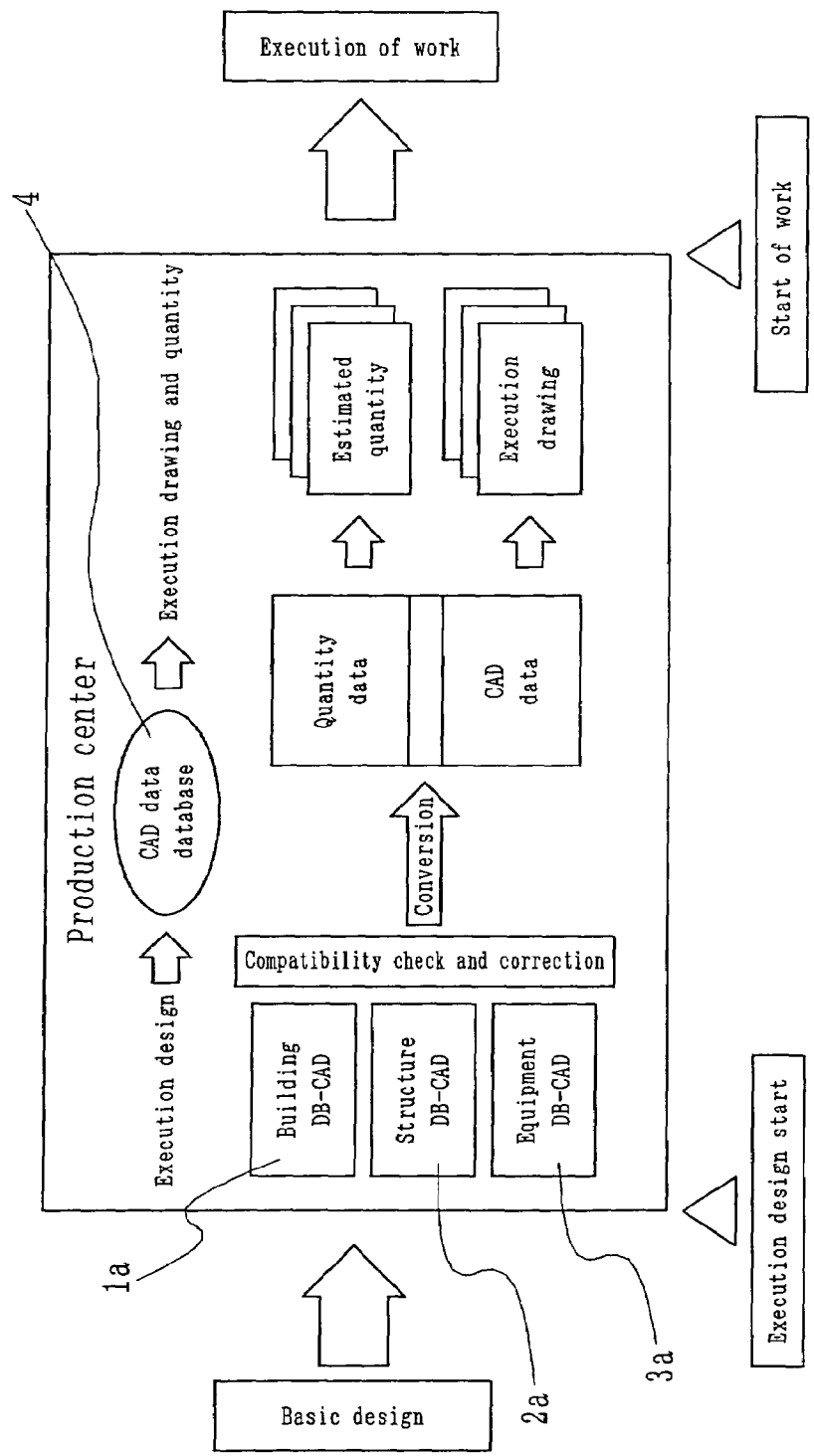
FIG. 2 is an explanatory diagram showing a system configuration for embodying an integrated building production information system of the present invention.

In carrying out the present invention, it is preferable that a new organization (called a production center, for example) operates a system according to the present invention, as shown in FIG. 2. And the new organization organizationally integrates and systematically operates with each other a DB-CAD (database CAD) system handled by a design department and an execution-linked system (for estimating quantities and making execution drawings) handled by an execution department in a conventional organization.

At the stage of execution design, the new organization systematically utilizes DB-CAD (building) 1a, DB-CAD (structure) 2a and DB-CAD (equipment) 3a of building, structure and equipment systems, makes compatible execution design drawings and specifications through three-dimensional superposition and consistently performs jobs up to estimation of quantities and preparation of execution drawings by diverting design data to the execution-linked system, and thereby improves the efficiency of work and reduces the expense of estimation/preparation of execution drawings.

And execution design drawings and specifications make high the degree of definite settlement, takes information of the execution side into design at an early stage and makes high the compatibility and linkage between design drawings and execution drawings, and thereby further improves the productivity.

Figure 3:
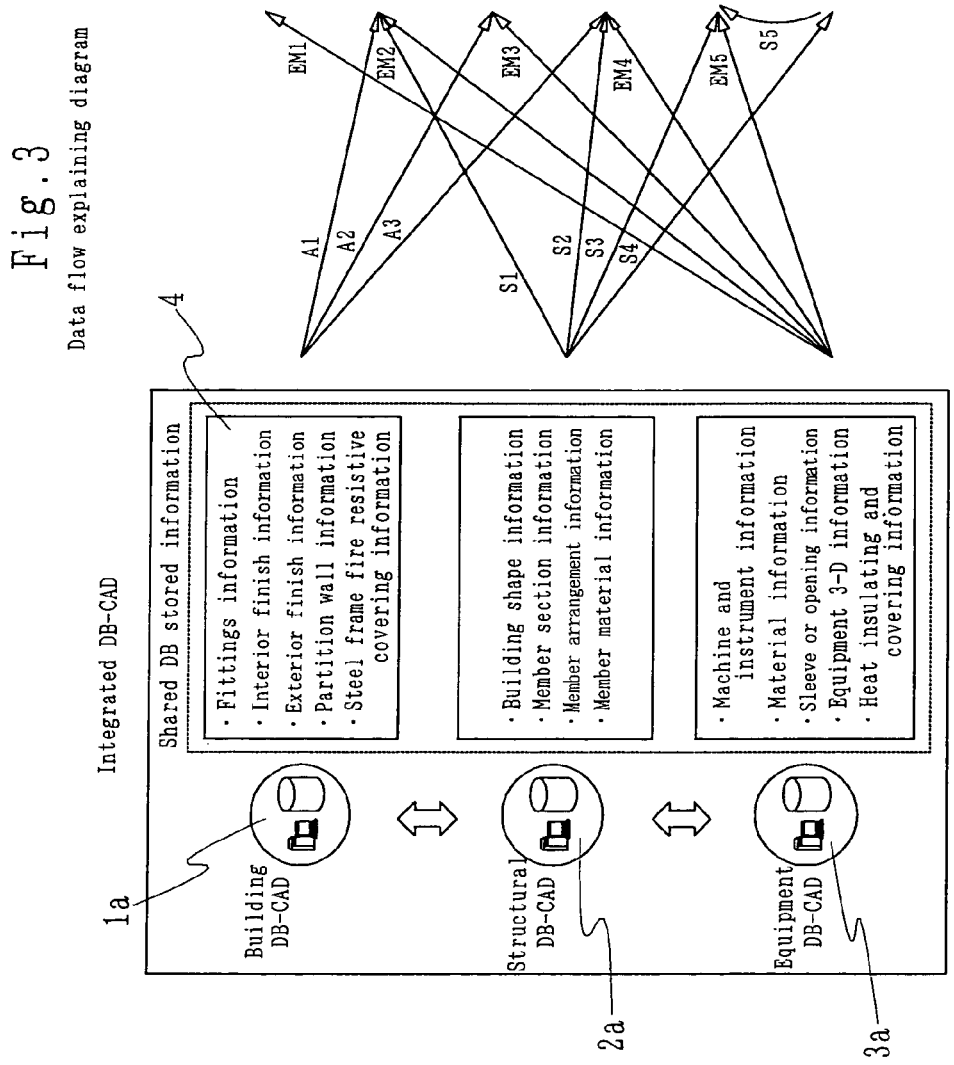
FIG. 3 is an explanatory diagram of data flow showing an embodiment of an integrated building production information system of the present invention.

FIG. 3 shows such a data flow, and as information stored in a shared database 4, in DB-CAD (building) 1a there are mentioned fittings information, interior finish information, exterior finish information, partition wall information and steel frame fire resistive covering information; in DB-CAD (structure) 2a there are mentioned building shape information, member section information, member arrangement information and member material information; and in DB-CAD (equipment) 3a there are mentioned machine and instrument information, materials information, sleeve and opening information, equipment 3-D information and heat insulating, and heat insulating and covering information.

The relation between these pieces of information stored in the shared database and a linked system is as follows.

Between a quantity estimation system 11 and DB-CAD (building) 1a, the system takes out information of the specifications and quantities of A1 fittings, the specifications and quantities of interior finish, the specifications and quantities of exterior finish, the specifications and quantities of partition walls, and the specifications and quantities of fire resistive coverings of steel frames (columns and beams) from the shared DB, makes a fittings table, an interior finish table, an exterior finish table and a fire resistive coverings quantity table, and links them with the estimation system.

Between a quantity estimation system (building, equipment and skeleton) 11 and DB-CAD (structure) 2a, the system takes out information of the material specifications, section list and arrangement of S1 concrete members, makes a quantity table of concrete, reinforcing bars and forms, and links it with the estimation system. The result is an estimation quantity table 11a.

Between a quantity estimation system 11 and DB-CAD (equipment) 3a, the system takes out information of the specifications, quantities and estimation divisions of EM2 machines and instruments, the quantities and estimation divisions of materials, the shapes, sizes and uses (estimation divisions) of sleeves or openings, and the specifications, quantities and uses (estimation divisions) of heat insulating materials from the shared DB, makes a quantity table for each estimation item, a quantity table of sleeves and a quantity table of heat insulating coverings, and links them with the estimation system.

Between steel frame CAD 14 and DB-CAD (structure) 2a or DB-CAD (equipment) 3a, the system takes out information of the material specifications, section list and arrangement of S3 steel frame members, the positions of column and beam reinforcing bars of S5 SRC, and the shapes, positions, sizes and uses of sleeves or openings of EM5 steel frames from the shared DB, and makes steel frame manufacturing drawings and calculates the execution quantity of steel frames. The result is a steel frame manufacturing drawing and execution quantity 14a.

Between reinforcing bar CAD 15 and DB-CAD (structure) 2a, the system takes out information of the material specifications, section list and arrangement of S4 RC members from the shared DB, and makes reinforcing bar drawings, processing notes and bar lists, and calculates the execution quantity of reinforcing bars. The result is reinforcing bar drawings, processing notes, bar lists and execution quantities 15a.

Between steel frame CAD 13 and DB-CAD (building) 1a or DB-CAD (structure) 2a or DB-CAD (equipment) 3a, the system takes out information of section lists and arrangement of S2 concrete and steel frame members, the shapes, positions and sizes of skeleton openings of A3 fittings, the shapes, positions and sizes of RC walls, the shapes, positions and sizes of facings of RC walls, and the shapes, positions sizes and uses of sleeves and openings of EM4 RC skeleton from the shared DB, and makes a skeleton drawing. The result is a skeleton drawing 13a.

Between synthetic drawing and finish execution drawing preparation CAD 12 and DB-CAD (building) 1*a* or DB-CAD (equipment) 3*a*, the system takes out information of A2 building plan section drawing data (two-dimensional) and EM3 equipment drawing data (two-dimensional) from the shared DB, and makes a synthetic drawing and a finish execution drawing. A part to be changed in a skeleton appearing in the synthetic drawing is changed by the skeleton drawing preparation CAD and thereby the accuracy of the skeleton drawing is improved. The result is the synthetic drawing and finish execution drawing 12*a*.

Between equipment execution drawing preparation CAD 10 and DB-CAD (equipment) 3*a*, the system takes out and links information of EM1 drawing data (in an original format) from the shared DB with a CAD for execution of equipment. And the system puts the data into the synthetic drawing and a layout drawing made by the present invention, performs a positional adjustment and improves the accuracy of an execution drawing. The result is an equipment execution drawing 10*a*.

INDUSTRIAL APPLICABILITY

As described above, since an integrated building production information system of the present invention makes it possible to first improve the quality of design drawings and next advance and easily perform a work of adjustment in a short time, this system brings shortening of the whole process and, additionally to this, makes it possible to divert compatible data made at an execution design stage by a synthetic DB-CAD system to the processes at estimation and execution stages after that stage and comprehensively improve the efficiency of building production, and this system has the following effects.

The system synthetically utilizes DB-CAD's of building, structure and equipment systems at an execution design stage, makes compatible execution design drawings and specifications by means of three-dimensional superposition and consistently performs jobs up to estimation of quantities and preparation of execution drawings by diverting design data to an execution-linked system, and thereby makes it possible to improve the efficiency of work and reduce the expense of estimation/preparation of execution drawings.

And the system can further improve the productivity by making high the degree of definite settlement of execution design drawings and specifications, taking information of an execution side at an early stage into design and making high the compatibility and linkage between design drawings and execution drawings.

In the aspect of design as well, the system provides execution design drawings and specifications having a high degree of definite settlement and a high compatibility, and greatly improves the quality. Although to make high the degree of definite settlement is a job of a designer, this includes the approval of a customer and the like, and this cannot necessarily be made high by only the designer. However, the decision of a designer itself at a stage as early as possible requires a high capability and a concentrated work, and a manner of not postponing decidable matters brings the improvement in the whole productivity of building production. The responsibility for this lies greatly with the design stage being an upstream process.

A system of the present invention is slightly higher in man-hour of design at the preparation stage of execution design in comparison with the prior art, but what is called left-off jobs of design frequently occurring up to now at the stage of supervision of construction work results in being reduced and can be settled in a range of adjustment of man-hour.

The compatibility between design drawings and execution drawings is an old and new problem, and has been taken up as a main theme over several years by a construction industry system study meeting seminar promoted by Japan Productivity Center. This also proves how difficult to secure the compatibility is.

As effects in execution, first there can be mentioned the utilization of estimation of quantities. At present the estimation of skeleton (concrete, forms and reinforcing bars) is put to practical use by an estimation department of a branch office. In a severe cost competition, an effect of being able to manage the quantities being the core of a building for itself appears in a field of steel frame, equipment and the like where the degree of dependence on cooperative companies has been great up to now.

Second, there is mentioned a great effect of reducing jobs in a building site which have been spent for redo caused by design or for improvement in the degree of definite settlement of design by taking information of the execution side at an early stage into design and performing the design having a high degree of definite settlement and a high compatibility.

And there is mentioned an effect of being able to provide a synthetic drawing and an execution drawing to a building site at an earlier stage in comparison with the prior art. A synthetic drawing efficiently made by data linkage adds an execution settlement and also makes clear a part to be decided by the building site at the execution stage. This makes it possible for the building site to mutually check various manufacturing drawings on the basis of this synthetic drawing and smoothly perform a construction management.

Since, also, a skeleton drawing is automatically made on the basis of the above-mentioned synthetic drawing, the reliability of it is high. As for equipment, the present invention utilizes data as an equipment execution original drawing and makes it possible for a cooperative company to divert the data to an equipment execution drawing and start the utilization of it in a job which has started execution.

Third, there is mentioned an effect of reducing the expense of outside order. Up to now the estimation of quantities and the preparation of synthetic drawings and execution drawings have depended mainly on outside order offices, but the advance of internal preparation thanks to data linkage brings the reduction of outside order expense.

Fourth, an effect of improvement in compatibility can be expected by a fact that various pieces of information are unified and the compatibility is naturally obtained or the efficiency of collating operations is improved by developing information linking functions of CAD's as an integrated database CAD system.

What is claimed is:

1. An integrated building production information system comprising a design CAD (computer-aided design) based on software of building, structure and equipment, and databases built in the outside separately from this design CAD, said databases making an integrated DB-CAD system of building, structure and equipment as an execution-linked system of DB-CAD's sharing data of a standard database, wherein said integrated building production information system stores the information made compatible by three-dimensional superposition at the time of design into the shared database (DB) of the integrated DB-CAD system and further receives and links information of this shared database to outside systems such as a skeleton drawing CAD, a reinforcing bar and steel frame system and the like and makes execution information.

2. An integrated building production information system according to claim 1, wherein said design CAD makes a building model virtually reproducing a building to be actually built after now inside a computer software product using a personal computer-based three-dimensional CAD programmed so that a shape made on CAD software and an attribute being its own property are linked with each other in the CAD software, and stores building specifications such as the specifications, dimensions, quantities, heights and the like of a structural skeleton, finish, fittings, equipment piping, ducts, and machines and instruments as attribute data into the shared database.

3. An integrated building production information system comprising design CAD's, databases built in the outside separately from these design CAD's and means for linking and integrating various DB-CAD's, wherein;

said design CAD's are based on software of building, structure and equipment, said databases make an integrated DB-CAD database of building, structure and equipment as an execution-linked system in DB-CAD's, said integrated DB-CAD database making it possible to grasp and share quantities by sorting data of a standard database into character information and pattern information by means of a design CAD on a personal computer, unify specifications and quantities and unify data flows from design information to estimation and execution information, said database CAD's comprise three DB-CAD's including a building DB-CAD related to finish, fittings and the like, an equipment DB-CAD related to machines and instruments, piping, ducts, wiring and the like, and a structure DB-CAD related to columns, beams, slabs and the like, between the building DB-CAD and the equipment DB-CAD, said means for linking and integrating these DB-CAD's with one another provides equipment 3-D information (three-dimensional information of equipment) from the equipment DB-CAD to the building DB-CAD, returns 3-D interference information from the building DB-CAD to the equipment DB-CAD, and provides plan information (plan drawing, room area, room name, ceiling height and floor height) and skeleton information such as building shape information, building member information, building section information and the like at the beginning of making a drawing, between the structure DB-CAD and the equipment DB-CAD, said means provides such skeleton information as building shape information, building member information, building section information and the like from the structure DB-CAD to the equipment DB-CAD, and returns skeleton opening (sleeve) information such as information of making a hole and the like in said skeleton information from the equipment DB-CAD to the structure DB-CAD, and between the building DB-CAD and the structure DB-CAD, said means transfers reciprocally such skeleton information as building shape information, building member information, building section information and the like, and confirms mutually said skeleton information.

4. An integrated building production information system according to claim 3, further realizing the linkage of data between different CAD software products, reciprocally transferring data described with character information (DB information), realizing the exchange of three-dimensional data with attribute, and making the data reading CAD side reproduce the attribute and pattern on the basis of the data.

* * * * *